United States Patent
Cowie et al.

(10) Patent No.: US 7,895,507 B1
(45) Date of Patent: Feb. 22, 2011

(54) ADD-COMPARE-SELECT STRUCTURES USING 6-INPUT LOOKUP TABLE ARCHITECTURES

(75) Inventors: Elizabeth R. Cowie, Edinburgh (GB); David I. Lawrie, Midlothian (GB)

(73) Assignee: Xilinx, Inc., San Jose, CA (US)

( * ) Notice: Subject to any disclaimer, the term of this patent is extended or adjusted under 35 U.S.C. 154(b) by 1042 days.

(21) Appl. No.: 11/707,311

(22) Filed: Feb. 16, 2007

(51) Int. Cl.
*H03M 13/41* (2006.01)

(52) U.S. Cl. ................................. 714/795
(58) Field of Classification Search .......... 714/795
See application file for complete search history.

(56) References Cited

U.S. PATENT DOCUMENTS

| | | | | |
|---|---|---|---|---|
| 5,412,669 A | * | 5/1995 | Foland, Jr. ............... | 714/796 |
| 5,838,729 A | * | 11/1998 | Hu et al. ............... | 375/265 |
| 6,070,263 A | * | 5/2000 | Tsui et al. ............... | 714/795 |
| 6,813,744 B1 | * | 11/2004 | Traeber ............... | 714/795 |
| 6,848,074 B2 | * | 1/2005 | Coombs ............... | 714/795 |
| 7,020,830 B2 | * | 3/2006 | D'Arcy et al. ............... | 714/795 |
| 7,131,055 B2 | * | 10/2006 | Mathew et al. ............... | 714/795 |
| 7,143,335 B2 | * | 11/2006 | Choi ............... | 714/795 |

* cited by examiner

*Primary Examiner*—Stephen M Baker
(74) *Attorney, Agent, or Firm*—Kevin T. Cuenot; Lois D. Cartier

(57) ABSTRACT

An Add-Compare-Select circuit for use with a trellis decoder can include a first module and a second module. The first module can provide a difference signal specifying an indication of a difference between a second path cost and a first path cost of a trellis. The second path cost can be a sum of a second state cost and a second branch metric and the first path cost can be a sum of a first state cost and a first branch metric. The second module can select the first path cost or the second path cost as a new cost according to the difference signal of the first module.

19 Claims, 4 Drawing Sheets

ADD-COMPARE-SELECT STRUCTURES USING 6-INPUT LOOKUP TABLE ARCHITECTURES

FIELD OF THE INVENTION

The invention relates to trellis decoding circuits and methods. More particularly, the invention relates to Add-Compare-Select (ACS) circuits that are incorporated within a trellis decoder.

BACKGROUND

Forward error correction (FEC) is a system of error control for data transmission often used in telecommunications applications. Convolutional coding is a type of FEC code in which each m-bit information symbol to be encoded is transformed into an n-bit symbol, where "n" is greater than or equal to "m" and "m/n" is referred to as the code rate. Data encoded using convolutional encoding is generally decoded with a trellis decoder, such as a Viterbi decoder or a Turbo decoder. A trellis decoder operates by constructing a trellis of state probabilities and branch metrics. After a computational latency, the results generated by the trellis decoder in a forward direction are read in a reverse order to find the maximal likelihood path through the trellis.

A Viterbi decoder, for example, typically includes a branch metric block, or circuit, a path metric block, and a traceback block. The branch metric block provides cost information for the data coming into the decoder. The path metric block can be implemented as an add-compare-select (ACS) block that compares the costs of the branches of the trellis. The traceback block traces back through the branches of the trellis according to ACS block comparisons to find the optimum path through the trellis to enable decoding of the data.

Turbo decoders also utilize ACS blocks to compare the costs through the trellis. A Turbo decoder will generally process the trellis in a forward and reverse direction in order to optimize the path through the trellis. In some variations of a Turbo decoder, the ACS block will be modified to incorporate an offset unit that can help to increase the performance of the algorithm. In such cases, the ACS block is referred to as an add-compare-select-offset (ACSO) block. A Turbo decoder can also utilize the output of one ACS block as the input to another. A typical difference between a Viterbi decoder ACS block and a Turbo decoder ACS block is that a Viterbi decoder ACS block will select a minimum cost, while the Turbo decoder ACS block will select a maximum cost.

Accordingly, ACS blocks can compare costs of various paths of the trellis to aid in selecting one path over another. FIG. 1 is a block diagram illustrating a simplified trellis 100. Each state probability, or "state", of the trellis 100 is shown as a circular node and is associated with a cost. For example, state 105 is associated with "Previous Cost 1" and state 110 is associated with "Previous Cost 2". The state 115 will be associated with the "New Cost" when computed and/or selected. The cost of a given state can be calculated from the cost of previous states which are added to the cost of the branches, called branch metrics, from the previous state to the current state.

With reference to FIG. 1, the "New Cost" of state 115 can be determined as the optimal path from either state 105 or state 110. The cost of moving from state 105 to state 115 can be calculated as the sum of the "Previous Cost 1" and the "Branch Metric 1". The cost of moving from state 110 to state 115 can be calculated as the sum of the "Previous Cost 2" and the "Branch Metric 2". The "optimal path" can be one that is, for example, the minimal cost path or the maximum cost path. The "New Cost" result from the trellis 100 can be selected as the current cost and can be provided or used in further cost calculations.

FIG. 2 is a block diagram illustrating a conventional ACS block 200 which can be incorporated into a trellis decoder. As shown, the ACS block 200 can include two adders 205 and 210, a comparator 215, and a multiplexer 220. A register 225 also can be placed at the output of the multiplexer 220. For illustration and ease of reference, the various inputs to, and output from, the ACS block 200 are labeled in a manner that corresponds to the trellis illustrated in FIG. 1. As noted, the result "New Cost" can be provided to further ACS blocks of the trellis decoder for use in decoding received data.

The adder 205 provides an output which is the sum of the "Previous Cost 2" and the "Branch Metric 2". The adder 210 provides an output which is the sum of the "Previous Cost 1" and the "Branch Metric 1". The comparator 215 generates the select signal as output which is provided to the multiplexer 220. The select signal is determined according to the expression "Select Signal=(Previous Cost 2+Branch Metric 2)−(Previous Cost 1+Branch Metric 1)". Typically, the select signal is the most significant bit (MSB) of the subtraction. The ACS further provides an output indicating the selected path. This output, however, may not be used in every case, for example, in the case of typical Turbo decoding.

When implementing ACS block 200 in hardware, one consideration is the size of the ACS block. For example, within a circuit designed for performing Viterbi error correction with a standard constraint length of 7, a Viterbi decoder would require 64 ACS blocks. As another example, a Viterbi decoder with a constraint length of 9, as is commonly used in the $3^{rd}$ Generation Mobile System Standards promulgated by the $3^{rd}$ Generation Partnership Project (3GPP), would require 256 ACS blocks. In view of the number of ACS blocks needed to implement decoder circuits, it can be seen that the size of the ACS block can significantly influence the size of the decoder.

Another consideration is the speed of the ACS block. The critical paths of circuits within the decoder typically are located in the feedback loop between ACS blocks. For example, with reference to FIG. 2, the critical path would begin at the output from the register 225 of ACS block 200 and continue through a subsequent ACS block. That is, the critical path typically starts at register 225 and continues through another adder, another comparator, and another multiplexer corresponding to the next ACS block in the decoder. Decreasing critical path lengths within the ACS block can contribute to faster decoders.

SUMMARY

The present invention is directed to Add-Compare-Select (ACS) circuits that are incorporated within a trellis decoder. One embodiment of the present invention can include an ACS circuit having a first module and a second module. The first module can provide a difference signal specifying an indication of a difference between a first path cost and a second path cost of a trellis. The first path cost can be a sum of a first state cost and a first branch metric and the second path cost can be a sum of a second state cost and a second branch metric. The second module can select the first path cost or the second path cost as a new cost according to the difference signal of the first module.

The first module can be implemented as a 3-input adder module. Further, the first module can be implemented using 6-input lookup tables (LUTs). The first module can include a first input that receives a signal specifying the first state cost, a second input that receives a signal specifying the second state cost, and a third input that receives a signal specifying a difference between the second branch metric and the first branch metric.

The second module also can be implemented as a 3-input adder module. Additionally, the second module can be implemented using 6-input LUTs. The second module can include a first input that receives the difference signal from the first adder module, a second input that receives a signal specifying the first branch metric, and a third input that receives a signal specifying the first state cost. The second module can compute the new cost solely from received input signals according to the difference signal.

In another embodiment, the ACS circuit can include a memory and a third module. The memory can receive the difference signal. The third module can receive the new cost and a value from the memory determined according to the difference signal. The third module can adjust the new cost according to the value received from the memory.

Another embodiment of the present invention can include an ACS circuit comprising a 3-input adder module that generates a difference signal specifying an indication of a difference between a second path cost and a first path cost for a trellis. The ACS circuit also can include a first 2-input adder module that determines the first path cost, a second 2-input adder module that determines the second path cost, and a multiplexer that selects either the first path cost from the first 2-input adder module or the second path cost from the second 2-input adder module as a new cost. The new cost can be selected according to the difference signal from the 3-input adder module.

The 3-input adder module can include a first input receiving a signal specifying a first state cost associated with the first path cost, a second input receiving a signal specifying a second state cost associated with the second path cost, and a third input receiving a signal specifying a difference between a second branch metric associated with the second path cost and a first branch metric associated with the first path cost.

The first 2-input adder module can determine the first path cost by summing an input signal specifying the first state cost with another input signal specifying the first branch metric. The second 2-input adder module can determine the second path cost by summing an input signal specifying the second state cost with another input signal specifying the second branch metric. The 3-input adder module can be formed of 6-input LUTs. The first 2-input adder module, the second 2-input adder module, or both, can be formed from 6-input LUTs.

In another embodiment, the ACS circuit can include a memory and an additional adder module. The memory can receive the difference signal. The additional adder module can receive the new cost and a value from the memory determined according to the difference signal. The additional adder module can adjust the new cost according to the value received from the memory.

Another embodiment of the present invention can include a computer program product. The computer program product can include a computer usable medium having computer usable program code that implements an ACS circuit within a programmable logic device. The computer program product can include computer usable program code that creates a first module that receives three inputs comprising a first state cost, a second state cost, and a difference between a second branch metric and a first branch metric. The first module can generate a difference signal that specifies an indication of a difference between a second path cost and a first path cost. The second path cost can be a sum of the second state cost and the second branch metric and the first path cost can be a sum of the first state cost and the first branch metric. The computer program product further can include computer usable program code that creates a second module that selects either the first path cost or the second path cost as a new cost according to the difference signal.

The computer usable program code that creates the second module further can include computer usable program code that creates structure within the second module that selects the first path cost as the new path cost and sums the first state cost and the first branch metric to determine the new cost. The computer usable program code that creates the second module further can include computer usable program code that creates structure within the second module that selects the second path cost as the new path cost and adds the first state cost and the first branch metric to the difference between the second path cost and the first path cost to determine the new cost.

In another embodiment, the computer program product can include computer usable program code that creates a memory that receives the difference signal as well as computer usable program code that creates a third module. The third module can receive the new cost and a value from the memory determined according to the difference signal. The third module can adjust the new cost according to the value received from the memory.

In another embodiment, the computer program product can include computer usable program code that creates a third module that sums the first state cost and the first branch metric to determine the first path cost and computer usable program code that creates a fourth module that sums the second state cost and the second branch metric to determine the second path cost. The computer usable program code that creates a second module further can include computer usable program code that creates structure within the second module that receives the first path cost from the third module, the second path cost from the fourth module, and the difference signal.

DETAILED DESCRIPTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed herein are directed to implementing Add-Compare-Select (ACS) and Add-Compare-Select-Offset (ACSO) circuits within a digital circuit design. While specific reference is made to an ACSO circuit or block herein, for example, with respect to FIGS. 5 and 6, in general, ACS and ACSO circuits are collectively referred to as to as "ACS blocks" or "ACS circuits". In this regard, ACSO blocks can be viewed largely as another variety of ACS block. ACS blocks are incorporated into decoders, including, but not limited to, Viterbi decoders, Turbo decoders, and the like. An ACS block as described herein, can be implemented using a programmable logic device (PLD), such as a field programmable gate array (FPGA), which incorporates 6-input lookup tables (LUTs). In one embodiment of the present invention, the ACS block implementation requires less area than conventional ACS blocks. In another embodiment, the ACS block implementation can operate at a higher operating frequency than conventional ACS block implementations.

Figure 3:
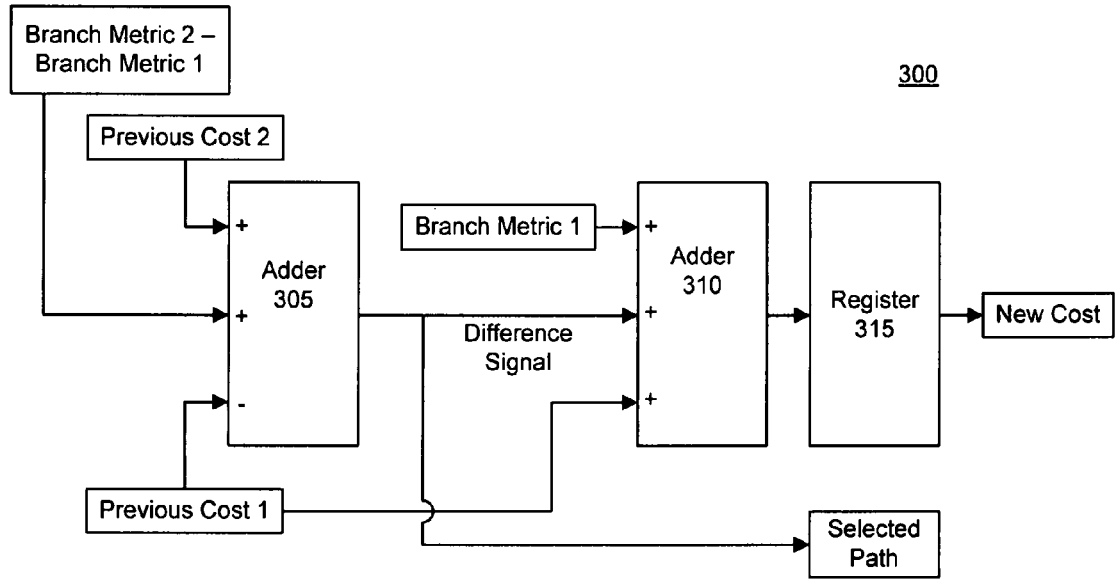
FIG. 3 is a block diagram illustrating an ACS block in accordance with one embodiment of the present invention.

FIG. 3 is a block diagram illustrating an ACS block 300 in accordance with one embodiment of the present invention. FIG. 3 illustrates an embodiment of the present invention in which the ACS block 300 has been optimized in terms of requiring less area for implementation. In general, the ACS block 300 utilizes 3-input adders thereby eliminating the comparator found in a conventional ACS block implementation. The ACS block 300 can be used with any of a variety of decoders to select an optimal path through a trellis when decoding data. Because decoders often require a significant number of ACS blocks, it can be seen that a reduction in the amount of area needed to implement an ACS block can lead to a significant reduction in the amount of area required to implement the decoder.

The ACS block 300 can include a first adder 305, a second adder 310, and a register 315. Each of the adders 305 and 310 can be implemented as 3-input adders which can be created, or formed, on a PLD using lookup tables (LUTs). A LUT refers to a programmable element commonly found in FPGA logic blocks. In general, a LUT is a memory array that is addressable by a number of input signals. While 4-input LUTs are common, LUTs having more or fewer input signals can also be implemented that will accommodate larger or smaller logic functions. For example, the Virtex™-5 series FPGA available from Xilinx Inc. of San Jose, Calif., provides 6-input LUTs. (Virtex and Xilinx are trademarks of Xilinx Inc. in the United States, other countries, or both). By programming predetermined values into the memory array, the LUT can implement virtually any function of the input variables or signals.

The ACS block 300 utilizes a pre-calculation of branch metrics which takes place outside of the ACS block 300. A branch metric block can calculate branch metrics using Hamming Distance, Euclidean Distance, or some other technique. In any case, the branch metric block can calculate various quantities relating to the branch metrics such as the following relationship: (Branch Metric 2)−(Branch Metric 1). A signal specifying this expression can be provided from the branch metric block as output to the ACS block(s).

It should be appreciated that since there usually is a single branch metric block required for a decoder, the branch metric block can be modified to produce such signals through the addition of several adders to the entire decoder. With this in mind, it can be seen that any overhead introduced by the additional adders to the branch metric block can be outweighed by the reduction in area, or increase in operating speed, that can be attained using the different embodiments of the present invention disclosed herein.

Figure 1:
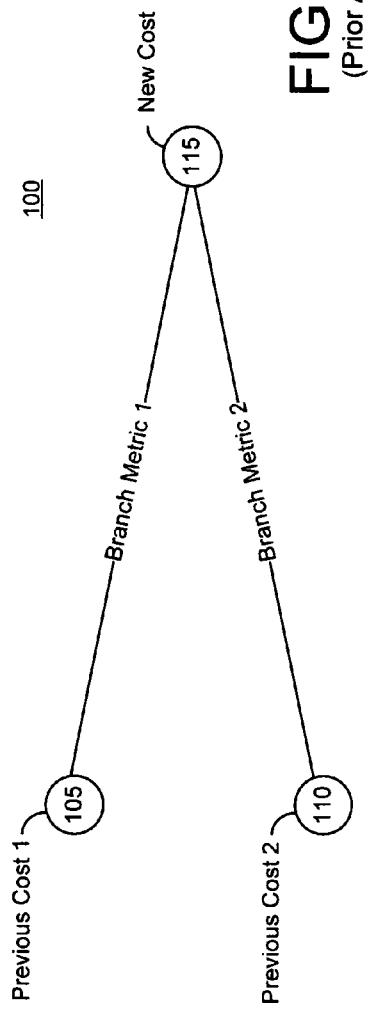
FIG. 1 is a block diagram illustrating a trellis which is useful for understanding the present invention.
Figure 2:
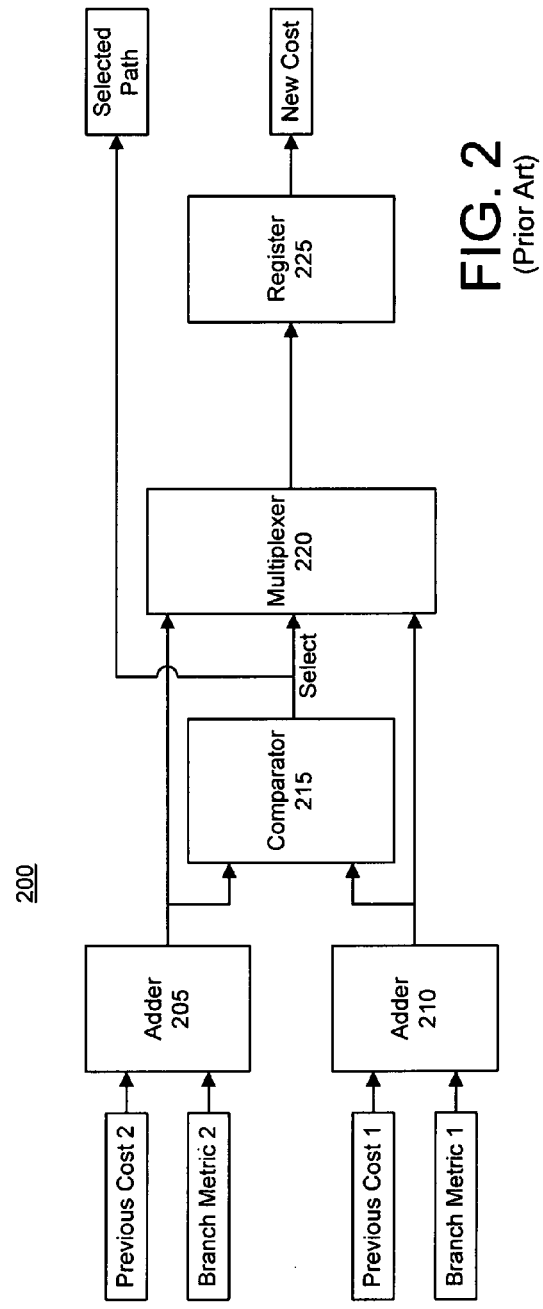
FIG. 2 is a block diagram illustrating a conventional Add-Compare-Select (ACS) block.

Continuing with FIG. 3, the adder 305 includes three inputs. Using the exemplary trellis of FIG. 1 for reference, the three inputs of the adder 305 can receive the following signals: a signal specifying the "Previous Cost 1", a signal specifying the "Previous Cost 2", and a signal specifying the difference between the "Branch Metric 2" and the "Branch Metric 1". As noted, the adder 305 can be implemented, for example, using a plurality of 6-input LUTs and can be programmed to calculate various functions of the input signals.

In one embodiment, the adder 305 can calculate the expression "Difference=Previous Cost 2+(Branch Metric 2−Branch Metric 1)−Previous Cost 1". This expression can be rewritten in the form "Difference=(Previous Cost 2+Branch Metric 2)−(Previous Cost 1+Branch Metric 1)". The difference signal can specify an indication of the difference. In this case, the difference signal can specify the result of the calculation which can be provided from the adder 305 to the adder 310. Thus, the output from the adder 305 is the difference between the cost of the second path, i.e., "Previous Cost 2+Branch Metric 2", and the cost of the first path, i.e., "Previous Cost 1+Branch Metric 1". As shown, the difference signal from the adder 305 also can be provided as a path selection signal that indicates the selected path.

The adder 310 also can include three inputs and can be formed of a plurality of 6-input LUTs. The adder 310, however, can be further modified to perform both adding and multiplexing functions. The inputs of the adder 310 can receive the following signals: a signal specifying the "Branch Metric 1", a signal specifying the "Previous Cost 1", and the difference signal provided from the adder 305.

As noted, the difference signal indicates which path has the smallest or largest cost depending upon the decoder implementation within which the ACS block 300 is disposed. The most significant bit (MSB) of the difference signal can be used by the adder 310 to determine whether to select the first path or the second path. In one embodiment, the adder 310 can be programmed to implement the following functions. If the MSB specified by the difference signal from adder 305 is 0, the "New Cost" specified by the output signal from the adder 310 can be calculated as "New Cost=Previous Cost 1+Branch Metric 1". If the MSB is 1, the "New Cost" can be specified as "New Cost=Difference Signal+Previous Cost 1+Branch Metric 1". Since the difference signal specifies "(Previous Cost 2+Branch Metric 2)−(Previous Cost 1+Branch Metric 1)", the expression for the "New Cost" can be simplified to "New Cost=Previous Cost 2+Branch Metric 2".

In another embodiment, the adder 310 can be configured to select or pass "Previous Cost 1+Branch Metric 1" if the MSB is a 1 and "Previous Cost 2+Branch Metric 2" if the MSB is a 0. The output of the adder 310 can be registered using register 315. The ACS block 300 can be replicated as may be required to implement a trellis decoder.

Figure 4:
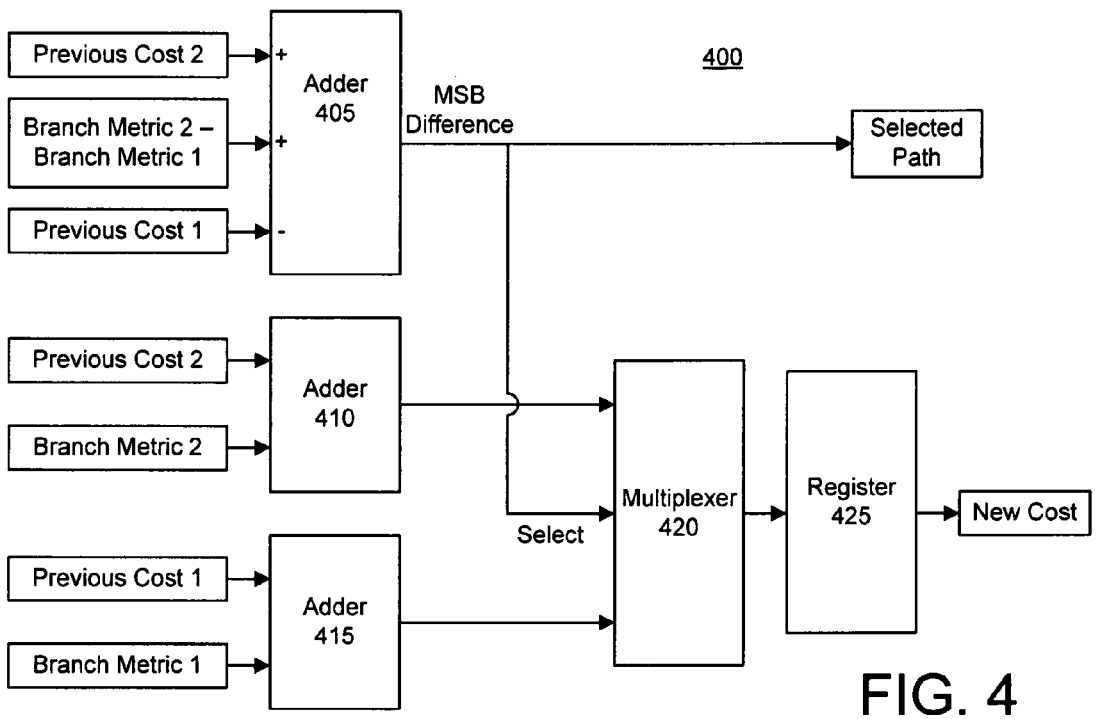
FIG. 4 is a block diagram illustrating an ACS block in accordance with another embodiment of the present invention.

FIG. 4 is a block diagram illustrating an ACS block 400 in accordance with another embodiment of the present invention. FIG. 4 illustrates an embodiment of the present invention in which the ACS block 400 has been optimized in terms of speed. The ACS block 400 performs the comparison of path costs in parallel with adders as shown. This parallel calculation reduces the critical path through the ACS block 400.

The ACS block 400 can include a first adder 405, a second adder 410, a third adder 415, a multiplexer 420, and a register 425. The adder 405 can be implemented as a three input adder, while the adders 410 and 415 can be implemented as 2-input adders. The adder 405, adder 410, adder 415, and multiplexer 420 can be implemented using 6-input LUTs, for example, as has been discussed.

The adder 405 can be programmed to perform a comparison, or calculate the difference, between the cost of the second path of the trellis (Previous Cost 2+Branch Metric 2) and the cost of the first path of the trellis (Previous Cost 1+Branch Metric 1). The adder 405 can include three inputs. The three inputs can receive the following signals: a signal specifying the "Previous cost 1", a signal specifying the "Previous cost 2", and a signal specifying the difference between the "Branch Metric 2" and the "Branch metric 1". Branch metrics can be calculated outside of the ACS block 400 as described with reference to the ACS block 300 of FIG. 3.

The adder 410 can sum the "Previous Cost 2" with the "Branch Metric 2" and provide the resulting sum as an output signal. The adder 415 can sum the "Previous Cost 1" and the "Branch Metric 1" and provide the resulting sum as an output signal. The multiplexer 420 can select, or pass, either the output from the adder 410 or the output from the adder 415 depending upon the MSB provided as a select signal from the adder 405 and the type of decoder in which the ACS block 400 is disposed. The signal passed by the multiplexer 420 can be the "New Cost" which can be registered by register 425 and then passed on to one or more other circuits or systems of the decoder. As shown, the output from adder 405 also can be provided as a path select signal indicating the selected path.

In this embodiment, since the adders 410 and 415 are included and calculate the quantities "Previous Cost 2+Branch Metric 2" and "Previous Cost 1+Branch Metric 1" respectively, only the MSB from the adder 405 is needed as output as opposed to the entire difference. As can be seen from FIG. 4, the critical path through the ACS block 400 has been reduced from the conventional case of a feedback path, an adder, a comparator, and a multiplexer, to a critical path that includes a feedback path, the 3-input adder 405, and the multiplexer 420. By reducing the critical path, significant increases in operating frequency of the ACS block 400 can be achieved as compared to conventional ACS blocks.

Figure 5:
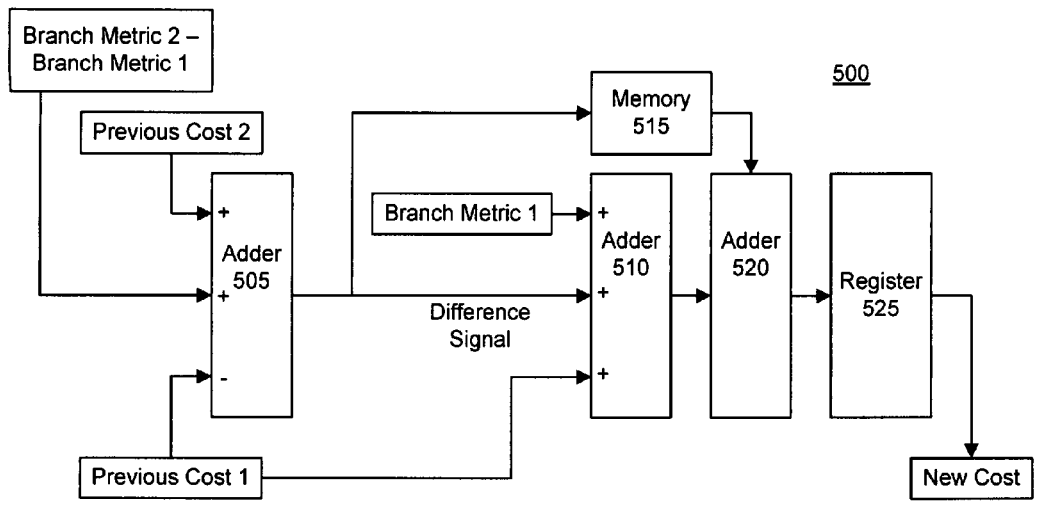
FIG. 5 is a block diagram illustrating an Add-Compare-Select-Offset (ACSO) block in accordance with another embodiment of the present invention.

FIG. 5 is a block diagram illustrating an ACSO block 500 in accordance with another embodiment of the present invention. The ACSO block 500 of FIG. 5 illustrates an embodiment of the present invention in which, similar to ACS block 300 of FIG. 3, the ACSO block 500 has been optimized in terms of area. In addition to the adder 505, adder 510, and register 525, as have been discussed with reference to FIG. 3, the ACSO block 500 further includes a memory 515 and an adder 520. The adder 520 can be implemented as a 2-input adder. The memory 515 provides a value to the adder 520 that is determined from the difference signal, which specifies a difference value from adder 505. The difference signal can be used as an index into the memory 515 for selecting the appropriate value to be provided to the adder 520. As noted, the adder 510 can be configured to select the smallest or largest path according to the particular decoder in which the ACSO block 500 is located.

The additional memory 515 and adder 520 in ACSO block 500 provide enhanced accuracy in the case of a Turbo decoder. While the ACS block implementations described herein can be used with Viterbi decoders, Turbo decoders, as well as other decoder types, the addition of the memory 515 and the adder 520 helps to account for the non-linear nature of a Turbo decoder. In general, the memory 515 and the adder 520 can provide a correction to the output of the ACSO block 500.

Figure 6:
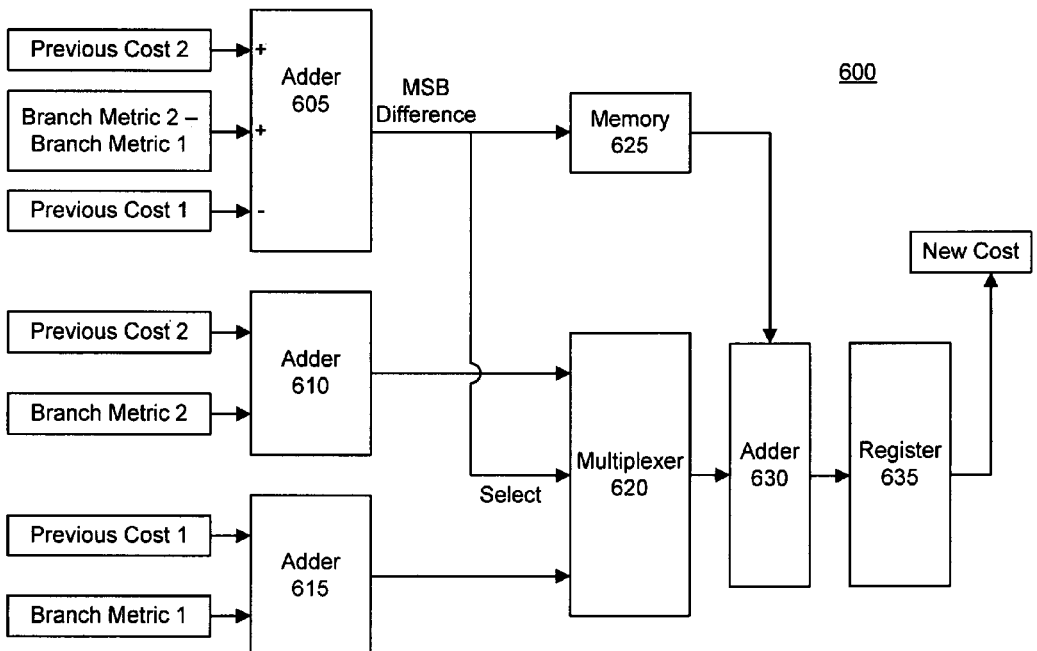
FIG. 6 is a block diagram illustrating an ACSO block in accordance with another embodiment of the present invention.

FIG. 6 is a block diagram illustrating an ACSO block 600 in accordance with another embodiment of the present invention. The ACSO block 600 of FIG. 6 illustrates an embodiment of the present invention in which, similar to ACS block 400 of FIG. 4, the ACSO block 600 has been optimized in terms of speed. The ACSO block 600 includes an adder 605, adders 610 and 615, a multiplexer 620, and a register 635 as discussed with reference to FIG. 4. Additionally, the ACSO block 600 includes a memory 625 as well as an adder 630. The adder 630 can be implemented as a 2-input adder. As discussed with reference to FIG. 5, the memory 625 provides a value to the adder 630 that is determined from the difference signal from adder 605. The difference signal, which specifies a difference value, can be used as an index into the memory 625 for selecting the appropriate value to be provided to the adder 630 to alter or add a correction to the output of the ACSO block 600. The multiplexer 620 can select the smallest or largest path according to the type of decoder with which the ACS block 600 is to be used.

Figure 7:
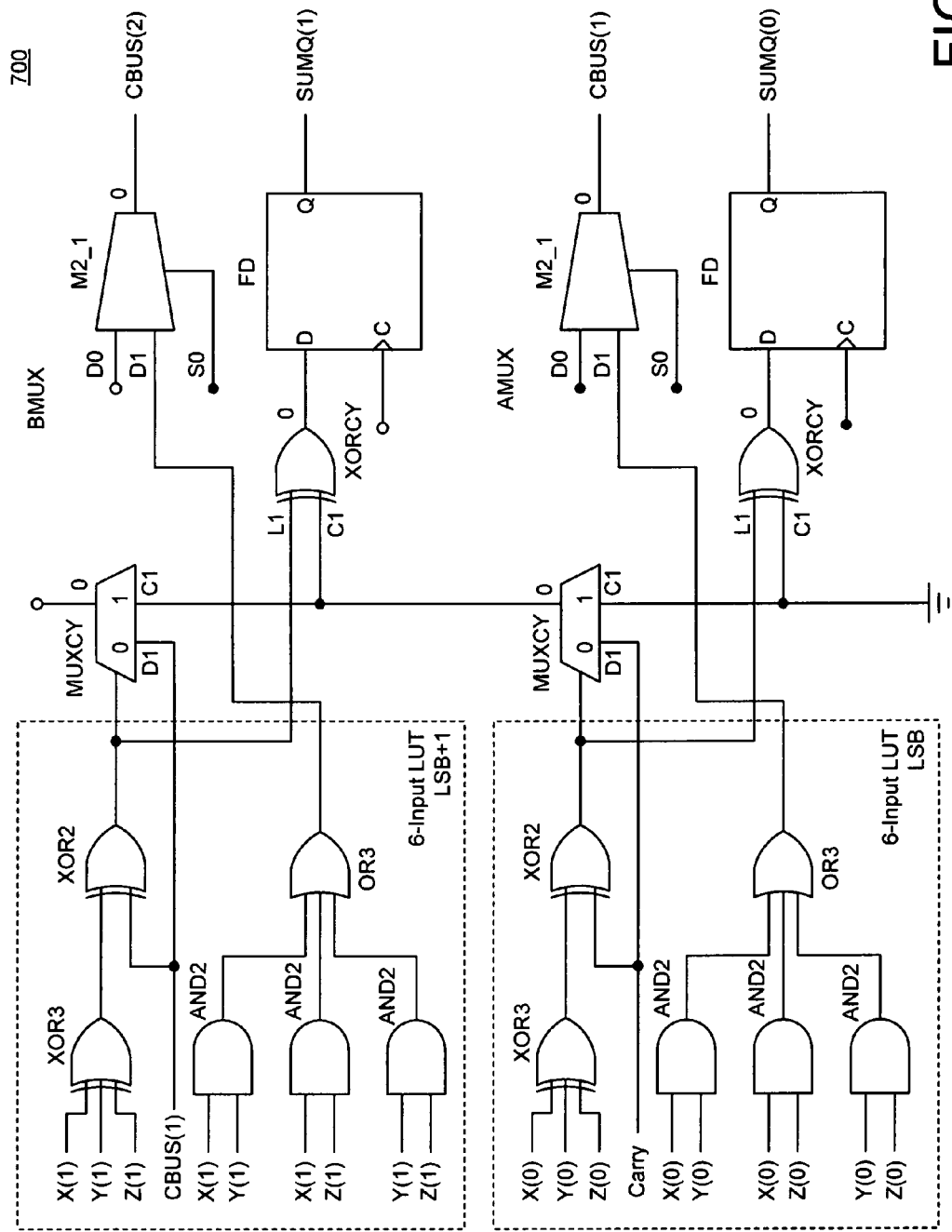
FIG. 7 is a block diagram illustrating a portion of an exemplary adder implementation within a programmable logic device which is useful for understanding the present invention.

FIG. 7 is a block diagram illustrating a portion of an adder implementation within a PLD that is useful for understanding the present invention. More particularly, the circuit 700, or portion thereof, illustrates two stages of a 3-input adder that can be constructed using 6-input LUTs as are available in the Virtex™-5 FPGA architecture from Xilinx Inc. The signals referenced as "X", "Y", and "Z" in FIG. 7 denote the inputs to the adder. The LUTs are labeled "LSB" and "LSB+1", and drive carry multiplexers MUXCY, exclusive OR gates XORCY, flip-flops FD, and output multiplexers M2_1 (AMUX and BMUX). These elements are coupled together as shown in FIG. 7, with the flip-flops FD providing the sum outputs SUMQ[1:0] and the output multiplexers M2_1 providing the carry outputs CBUS[2:1].

The embodiments disclosed herein provide ACS blocks that can reduce the area needed for implementation and ACS blocks that are capable of operating at increased clock speeds. While specific reference has been made to using the ACS block implementations with Viterbi decoders and/or Turbo decoders, it should be appreciated that the embodiments disclosed herein can be utilized with other decoders and/or systems as well.

The block diagrams in the Figures illustrate the architecture, functionality, and operation of possible implementations of systems, methods and computer program products according to various embodiments of the present invention. In this regard, each block in the block diagrams may represent a module, segment, or portion of code, which comprises one or more executable instructions for implementing the specified logical function(s).

It should also be noted that the various structures described herein can be specified by a bitstream which, when loaded into an appropriate PLD, such as an FPGA, creates or implements the various structures disclosed herein within the device. The bitstream can be stored or embodied in any of a variety of computer program products. The computer program products can include computer readable media such as optical media, magnetic media, computer memory, or one or more portions of a wired or wireless network through which the bitstream is propagated, or the like.

The present invention can be realized in hardware, software, or a combination of hardware and software. The present invention can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein. The present invention also can be embedded in a computer program product, which comprises all the features enabling the implementation of the methods described herein, and which when loaded in a computer system is able to carry out these methods.

The terms "computer program", "software", "application", variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an", as used herein, are defined as one or more than one. The term "plurality", as used herein, is defined as two or more than two. The term "another", as used herein, is defined as at least a second or more. The terms "including" and/or "having", as used herein, are defined as comprising, i.e., open language. The term "coupled", as used herein, is defined as connected, although not necessarily directly, and not necessarily mechanically, e.g., communicatively linked through a communication channel or pathway or another component or system.

This invention can be embodied in other forms without departing from the spirit or essential attributes thereof. Accordingly, reference should be made to the following claims, rather than to the foregoing specification, as indicating the scope of the invention.

What is claimed is:

1. An add-compare-select (ACS) circuit, comprising:
   a first module that provides a difference signal specifying an indication of a difference between a second path cost and a first path cost of a trellis, wherein the second path cost is a sum of a second state cost and a second branch metric and the first path cost is a sum of a first state cost and a first branch metric; and
   a second module that selects either the first path cost or the second path cost as a new cost according to the difference signal of the first module,
   wherein the first module comprises a first input that receives a signal specifying the first state cost, a second input that receives a signal specifying the second state cost, and a third input that receives a signal specifying a difference between the second branch metric and the first branch metric.

2. The ACS circuit of claim 1, wherein the first module comprises a 3-input adder module comprising a plurality of 6-input lookup tables.

3. The ACS circuit of claim 1, wherein the second module comprises a 3-input adder module comprising a plurality of 6-input lookup tables.

4. The ACS circuit of claim 1, further comprising:
   a memory coupled to receive the difference signal; and
   a third module coupled to receive the new cost and a value from the memory determined according to the difference signal, wherein the third module adjusts the new cost according to the value received from the memory.

5. The ACS circuit of claim 1, wherein the second module comprises a first input that receives the difference signal of the first module, a second input that receives a signal specifying the first branch metric, and a third input that receives a signal specifying the first state cost.

6. The ACS circuit of claim 5, wherein the second module computes the new cost solely from received input signals according to the difference signal.

7. An add-compare-select (ACS) circuit, comprising:
   a 3-input adder module that generates a difference signal specifying an indication of a difference between a second path cost and a first path cost for a trellis;
   a first 2-input adder module that determines the first path cost;
   a second 2-input adder module that determines the second path cost; and
   a multiplexer that selects either the first path cost from the first 2-input adder module or the second path cost from the second 2-input adder module as a new cost according to the difference signal from the 3-input adder module,
   wherein the 3-input adder module comprises a first input that receives a signal specifying a first state cost associated with the first path cost, a second input that receives a signal specifying a second state cost associated with the second path cost, and a third input that receives a signal specifying a difference between a second branch metric associated with the second path cost and a first branch metric associated with the first path cost.

8. The ACS circuit of claim 7, wherein the first 2-input adder module determines the first path cost by summing an input signal specifying the first state cost with another input signal specifying the first branch metric.

9. The ACS circuit of claim 7, wherein the second 2-input adder module determines the second path cost by summing an input signal specifying the second state cost with another input signal specifying the second branch metric.

10. The ACS circuit of claim 7, wherein the 3-input adder module comprises a plurality of 6-input lookup tables.

11. The ACS circuit of claim 7, wherein at least one of the first 2-input adder module or the second 2-input adder module comprises a plurality of 6-input lookup tables.

12. The ACS circuit of claim 7, further comprising:
   a memory coupled to receive the difference signal; and
   an additional adder module coupled to receive the new cost and a value from the memory determined according to the difference signal, wherein the additional adder module adjusts the new cost according to the value received from the memory.

13. An add-compare-select (ACS) circuit, comprising:
   a first module that provides a difference signal specifying an indication of a difference between a second path cost and a first path cost of a trellis, wherein the second path cost is a sum of a second state cost and a second branch metric and the first path cost is a sum of a first state cost and a first branch metric; and a second module that selects either the first path cost or the second path cost as a new cost according to the difference signal of the first module, wherein the second module comprises a first input that receives the difference signal of the first module, a second input that receives a signal specifying the first branch metric, and a third input that receives a signal specifying the first state cost.

14. The ACS circuit of claim 13, wherein the first module comprises a 3-input adder module comprising a plurality of 6-input lookup tables.

15. The ACS circuit of claim 13, wherein the first module comprises a first input that receives a signal specifying the first state cost, a second input that receives a signal specifying the second state cost, and a third input that receives a signal specifying a difference between the second branch metric and the first branch metric.

16. The ACS circuit of claim 13, wherein the second module comprises a 3-input adder module comprising a plurality of 6-input lookup tables.

17. The ACS circuit of claim 13, wherein the second module computes the new cost solely from received input signals according to the difference signal.

18. The ACS circuit of claim 13, further comprising:
a memory coupled to receive the difference signal; and
a third module coupled to receive the new cost and a value from the memory determined according to the difference signal, wherein the third module adjusts the new cost according to the value received from the memory.

19. An add-compare-select (ACS) circuit, comprising:
a first module that provides a difference signal specifying an indication of a difference between a second path cost and a first path cost of a trellis, wherein the second path cost is a sum of a second state cost and a second branch metric and the first path cost is a sum of a first state cost and a first branch metric;
a second module that selects either the first path cost or the second path cost as a new cost according to the difference signal of the first module;
a memory coupled to receive the difference signal; and
a third module coupled to receive the new cost and a value from the memory determined according to the difference signal, wherein the third module adjusts the new cost according to the value received from the memory.

* * * * *